United States Patent
Tsai et al.

(10) Patent No.: US 10,654,150 B2
(45) Date of Patent: May 19, 2020

(54) GRINDING DISK AND METHOD OF MANUFACTURING THE SAME

(71) Applicant: Industrial Technology Research Institute, Hsinchu (TW)

(72) Inventors: Wei-Chien Tsai, Miaoli County (TW); Hao-Wen Cheng, Pingtung County (TW); Jin-Bao Wu, Hsinchu (TW); Ming-Sheng Leu, Hsinchu County (TW)

(73) Assignee: Industrial Technology Research Institute, Hsinchu (TW)

(*) Notice: Subject to any disclaimer, the term of this patent is extended or adjusted under 35 U.S.C. 154(b) by 63 days.

(21) Appl. No.: 15/853,965

(22) Filed: Dec. 26, 2017

(65) Prior Publication Data

US 2019/0193247 A1    Jun. 27, 2019

(51) Int. Cl.
| | |
|---|---|
| *B24D 18/00* | (2006.01) |
| *C23C 16/56* | (2006.01) |
| *C23C 16/52* | (2006.01) |
| *C23C 16/32* | (2006.01) |

(52) U.S. Cl.
CPC .......... *B24D 18/00* (2013.01); *C23C 16/325* (2013.01); *C23C 16/52* (2013.01); *C23C 16/56* (2013.01)

(58) Field of Classification Search
CPC ....... B24D 18/00; C23C 16/00; C23C 16/325; C23C 16/52
See application file for complete search history.

(56) References Cited

U.S. PATENT DOCUMENTS

| | | |
|---|---|---|
| 4,505,720 A | 3/1985 | Gabor et al. |
| 4,588,419 A | 5/1986 | Caul et al. |
| 5,897,424 A | 4/1999 | Evans et al. |
| 6,019,672 A | 2/2000 | Damgaard |
| 6,071,343 A * | 6/2000 | Inaba ............... C04B 41/009 118/500 |
| 6,435,958 B1 | 8/2002 | Damgaard et al. |
| 6,439,986 B1 | 8/2002 | Myoung et al. |
| 2003/0036341 A1 | 2/2003 | Myoung et al. |
| 2007/0066194 A1 * | 3/2007 | Wielonski ......... B24B 53/017 451/443 |

(Continued)

FOREIGN PATENT DOCUMENTS

| | | |
|---|---|---|
| CN | 101292062 | 10/2008 |
| CN | 102699828 | 10/2012 |

(Continued)

OTHER PUBLICATIONS

"Office Action of Taiwan Counterpart Application," dated Mar. 13, 2018, p. 1-p. 7.

*Primary Examiner* — Pegah Parvini
(74) *Attorney, Agent, or Firm* — JCIPRNET (57) ABSTRACT

A grinding disk and a method of manufacturing the same are provided. The grinding disk includes a graphite base and a silicon carbide film, the silicon carbide film covering the graphite base, and the silicon carbide film has a surface grain size of 5 μm to 80 μm. By a hot-wall chemical vapor deposition system, a highly dense silicon carbide film is formed on a surface of the graphite base. The grinding disk may replace a conventional metallographic grinding and polishing disk, and is improved in characteristics such as hydrophobicity and abrasion resistance.

13 Claims, 10 Drawing Sheets

(56) References Cited

U.S. PATENT DOCUMENTS

| | | | | |
|---|---|---|---|---|
| 2010/0092728 A1* | 4/2010 | Hasegawa | ............... | B24B 9/16 |
| | | | | 428/143 |
| 2014/0113532 A1* | 4/2014 | Smith | ............... | B24B 53/017 |
| | | | | 451/443 |
| 2015/0051466 A1* | 2/2015 | Afroz | ............... | A61B 5/686 |
| | | | | 600/377 |

FOREIGN PATENT DOCUMENTS

| | | |
|---|---|---|
| CN | 106926148 | 7/2017 |
| JP | 4064391 | 3/2008 |
| TW | 583733 | 4/2004 |

* cited by examiner

GRINDING DISK AND METHOD OF MANUFACTURING THE SAME

TECHNICAL FIELD

The technical field relates to a grinding disk and a method of manufacturing the same.

BACKGROUND

Recently, as higher integration and higher performance have been achieved in semiconductor integrated circuits, new micromachining technology has been under development. A grinding process is often employed in producing various devices.

In the grinding process, an object to be ground is attached to a grinding head of a grinding system, and pressure is applied to press the object to be ground against a grinding disk. Then, the object to be ground and the grinding disk are caused to move relative to each other, thus gradually flattening a surface of the object to be ground, and planarization is thereby achieved. In addition, in the grinding process, a slurry containing chemical mixtures may also be supplied on the grinding disk so that the surface of the object to be ground can be flattened under both mechanical and chemical effects.

When the object to be ground is rotated on the grinding disk by being pressed, the object to be ground contacts the grinding disk to generate friction. After the grinding process has been performed for a long time, the surface of the grinding disk may thus wear down, which may affect grinding speed and grinding stability. Hence, a material of the grinding disk is required to have excellent physical and chemical properties such as thermal stability, abrasion resistance, corrosion resistance and so on. By imparting characteristics such as high hydrophobicity and abrasion resistance to the grinding disk, lifetime of the grinding disk may be prolonged.

SUMMARY

Exemplary embodiments of the disclosure provide a grinding disk having characteristics such as high abrasion resistance and high hydrophobicity and having long lifetime.

Exemplary embodiments of the disclosure provide a method of manufacturing a grinding disk, in which a highly dense silicon carbide film is deposited on a surface of a graphite base by using chemical vapor deposition system. By adjusting and controlling process parameters, surface grain size of the silicon carbide film is controlled, thereby obtaining a grinding disk having high abrasion resistance, high hydrophobicity and long lifetime.

The grinding disk according to the disclosure includes a graphite base and a silicon carbide film, the silicon carbide film covering the graphite base, and the silicon carbide film has a surface grain size of 5 μm to 80 μm.

According to one exemplary embodiment of the disclosure, a surface of the graphite base is a flat and smooth surface, or the surface of the graphite base has a trench.

According to one exemplary embodiment of the disclosure, the trench has a depth of 0.1 mm to 10 mm and a width of 0.05 mm to 20 mm.

According to one exemplary embodiment of the disclosure, the silicon carbide film has a cubic silicon carbide crystal.

According to one exemplary embodiment of the disclosure, the silicon carbide film has a carbon content of 30 at. % to 70 at. %, and a silicon content of 30 at. % to 70 at. %.

According to one exemplary embodiment of the disclosure, the silicon carbide film has a thickness of 30 μm to 1000 μm.

According to one exemplary embodiment of the disclosure, the silicon carbide film has surface roughness of 1.0 μm to 10.0 μm.

In the method of manufacturing a grinding disk according to the disclosure, a graphite base is provided. A silicon carbide film is formed on a surface of the graphite base, wherein in the step of forming the silicon carbide film on the surface of the graphite base, the silicon carbide film is formed by chemical vapor deposition using a carbon precursor, a silicon precursor, and hydrogen as a reaction gas.

According to one exemplary embodiment of the disclosure, in the step of forming the silicon carbide film on the surface of the graphite base, a reaction pressure is 1 Pa to $10^6$ Pa.

According to one exemplary embodiment of the disclosure, in the step of forming the silicon carbide film on the surface of the graphite base, a reaction temperature is 900° C. to 1600° C.

According to one exemplary embodiment of the disclosure, the method of manufacturing a grinding disk further includes forming at least one trench on the surface of the graphite base.

According to one exemplary embodiment of the disclosure, the carbon precursor is at least one selected from a group consisting of methane, ethane, acetylene and ethylene.

According to one exemplary embodiment of the disclosure, the silicon precursor is at least one selected from a group consisting of dichlorosilane ($SiH_2Cl_2$), trichlorosilane ($SiHCl_3$) and silicon tetrachloride ($SiCl_4$).

According to one exemplary embodiment of the disclosure, the silicon carbide film has a cubic silicon carbide crystal.

According to one exemplary embodiment of the disclosure, in the step of forming the silicon carbide film on the surface of the graphite base, a hot-wall chemical vapor deposition system is used.

Based on the above, the grinding disk according to the disclosure has high abrasion resistance and high hydrophobicity. By imparting higher hydrophobicity to the grinding disk, a better scrapings removing function is obtained, so that the occurrence of scratches can be reduced and a surface of a workpiece can be polished to achieve a mirror-like effect. Moreover, by providing the grinding disk with the abrasion-resistant silicon carbide film, the grinding disk can have a relatively long lifetime.

In the method of manufacturing a grinding disk according to the disclosure, the silicon carbide film is directly formed on the graphite base by the hot-wall chemical vapor deposition system. The grain size of the silicon carbide film is adjusted and controlled through the process parameters, which thus imparts high hydrophobicity and high abrasion resistance to the silicon carbide film. Thus, the lifetime of the silicon carbide film can be prolonged. The method of manufacturing a grinding disk according to the disclosure may be applied for manufacturing a metallographic grinding disk.

Several embodiments accompanied with figures are described in detail below to further describe the disclosure in details.

DETAILED DESCRIPTION OF DISCLOSED EMBODIMENTS

In a grinding disk and a method of manufacturing the same according to the disclosure, a hot-wall chemical vapor deposition system is primarily used to form a highly dense silicon carbide film on a surface of the graphite base. During formation of the highly dense silicon carbide film, surface grain size of the silicon carbide film may be controlled by multistage process control. The grinding disk may replace a conventional metallographic grinding and polishing disk, and is improved in characteristics such as hydrophobicity and abrasion resistance.

Figure 1A:
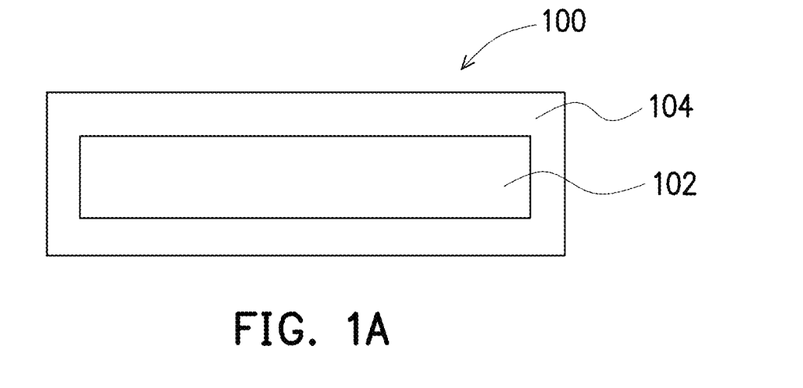
FIG. 1A is a schematic view of a grinding disk according to one exemplary embodiment of the disclosure.

FIG. 1A is a schematic view of a grinding disk according to one exemplary embodiment of the disclosure.

As shown in FIG. 1A, a grinding disk 100 includes a graphite base 102 and a silicon carbide film 104. The silicon carbide film 104 covers the graphite base 102.

The graphite base 102, for example, has high purity, and contains 400 ppm or less of impurities, thus reducing the chance of impurities contaminating the process. A surface of the graphite base 102 is, for example, a flat and smooth surface.

Silicon carbide (SiC) is a brittle material, having characteristics such as high purity, high toughness, good breaking resistance and so on. Due to its brittleness and good grinding ability, silicon carbide is suitable for producing an abrasive for cutting a semiconductor material, and is thus widely used for industrial purposes. Since silicon carbide also has excellent physicochemical properties such as thermal stability, abrasion resistance, corrosion resistance and so on, it may further be used in surface treatment, such as high temperature resistance treatment, thermal shock resistance and chemical corrosion resistance treatment, of key semiconductor parts and components, so as to prolong lifetime of workpieces and materials. In terms of structure, silicon carbide is typically divided into two types, one having a hexagonal or rhombic structure, including 6H—SiC, 4H—SiC and so on, collectively called α-SiC, and the other having a cubic silicon carbide crystal and being called 3C—SiC or β-SiC.

A method of preparing a silicon carbide film includes, for example, physical vapor deposition (PVD) and chemical vapor deposition (CVD). However, PVD is mostly used to prepare amorphous silicon carbide films and polycrystalline silicon carbide films. Moreover, as compared to CVD, a film formed by PVD is inferior in both uniformity and step coverage. CVD is a mature thick film growing technique and has characteristics such as large area deposition, high step coverage and high film uniformity.

In the present embodiment, the silicon carbide film 104, for example, has a cubic silicon carbide crystal (3C—SiC). In the silicon carbide film 104, the carbon content is, for example, 30 at. % to 70 at. %, and the silicon content is, for example, 30 at. % to 70 at. %. In another exemplary embodiment, in the silicon carbide film 104, the carbon content is, for example, 45 at. % to 55 at. %, and the silicon content is, for example, 45 at. % to 55 at. %. The silicon carbide film 104 has a thickness of, for example, 30 am to 1000 am. The silicon carbide film 104 has a surface grain size of, for example, 5 am to 80 am. The silicon carbide film 104 has surface roughness of, for example, 1.0 am to 10.0 am.

Figure 1B:
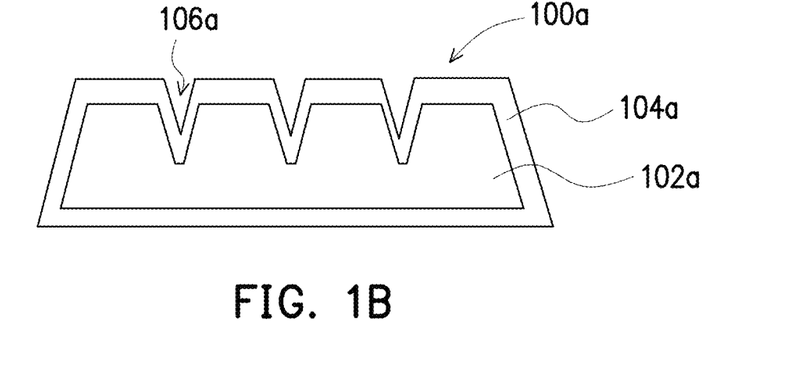
FIG. 1B is a schematic view of a grinding disk according to another exemplary embodiment of the disclosure.

FIG. 1B is a schematic view of a grinding disk according to another exemplary embodiment of the disclosure. Only the difference from the grinding disk 100 of FIG. 1A will be described herein.

As shown in FIG. 1B, a grinding disk 100a includes a graphite base 102a and a silicon carbide film 104a. The silicon carbide film 104a covers the graphite base 102a. A surface of the graphite base 102a has a trench 106a. The trench 106a has a depth of, for example, 0.1 mm to 10 mm, and a width of 0.05 mm to 20 mm. In the present embodiment, the trench 106a, for example, has a "V" shape in cross-section.

Figure 1C:
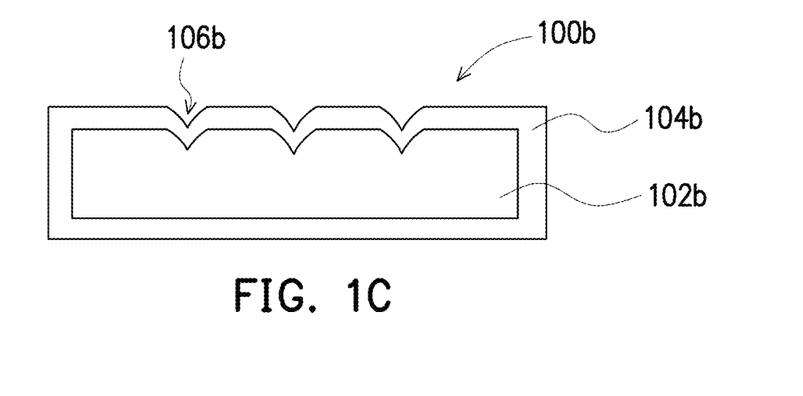
FIG. 1C is a schematic view of a grinding disk according to still another exemplary embodiment of the disclosure.

FIG. 1C is a schematic view of a grinding disk according to still another exemplary embodiment of the disclosure. Only the difference from the grinding disk 100 of FIG. 1A will be described herein.

As shown in FIG. 1C, a grinding disk 100b includes a graphite base 102b and a silicon carbide film 104b. The silicon carbide film 104b covers the graphite base 102b. A surface of the graphite base 102b has a trench 106b, rendering the surface of the graphite base 102b concave-convex.

In FIG. 1A to FIG. 1C, the examples are given in which the silicon carbide film 104 (104a, 104b) covers the entire surface of the graphite base 102 (102a, 102b). Of course, the silicon carbide film 104 may also be disposed on a single surface (grinding surface) of the graphite base 102. The silicon carbide film 104a may be disposed only on the surface (grinding surface) having the trench 106a formed thereon of the graphite base 102a. The silicon carbide film 104b may be disposed only on the concave-convex surface (grinding surface) (having the trench 106b formed thereon) of the graphite base 102b.

In addition, a pattern of the trench 106a (106b) on the surface of the graphite base 102a (102b) is in, for example, a checkerboard shape, a honeycomb shape, a spiral shape, a concentric circle shape and so on.

Next, a method of manufacturing the grinding disk according to the disclosure is described. Firstly, the graphite base 102 is provided, and the silicon carbide film 104 is then formed on a surface of the graphite base 102. In the step of forming the silicon carbide film 104 on the surface of the graphite base 102, the silicon carbide film is formed by CVD using a carbon precursor, a silicon precursor, and hydrogen ($H_2$) as a reaction gas. In the step of forming the silicon carbide film 104 on the surface of the graphite base 102, a hot-wall chemical vapor deposition system is used. The silicon carbide film 104, for example, has a cubic silicon carbide crystal. In the step of forming the silicon carbide film on the surface of the graphite base, a reaction pressure is, for example, 1 Pa to $10^6$ Pa, and a reaction temperature is 900° C. to 1600° C.

The carbon precursor is, for example, at least one selected from a group consisting of methane, ethane, acetylene and ethylene. The silicon precursor may include an organosilicon compound such as, for example, a chlorosilane compound ($SiH_2Cl_2$, $SiHCl_3$, $SiCl_4$, $CH_3SiCl_3$, $Si(CH_3)_2Cl_2$, etc.). In one exemplary embodiment, the silicon precursor is, for example, at least one selected from a group consisting of dichlorosilane, trichlorosilane and silicon tetrachloride.

In one exemplary embodiment, when manufacturing the grinding disk of FIG. 1B or FIG. 1C, at least one trench 106a (106b) may be formed in advance on the surface of the graphite base 102a (102b).

Figure 2:
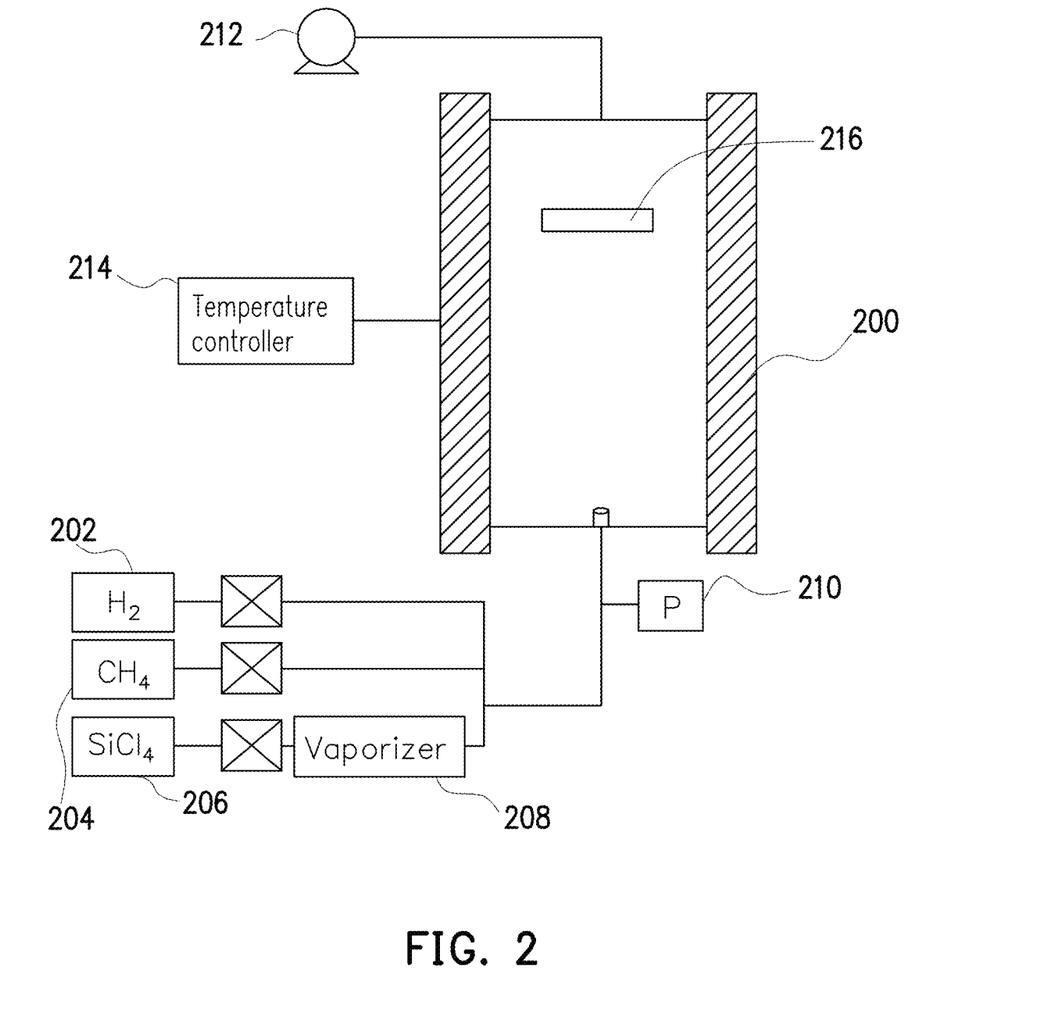
FIG. 2 is a schematic view of a hot-wall chemical vapor deposition system.

FIG. 2 is a schematic view of a hot-wall chemical vapor deposition system. In FIG. 2, an example is given using methane ($CH_4$) as the carbon precursor and using silicon tetrachloride ($SiCl_4$) as the silicon precursor. As shown in FIG. 2, the hot-wall chemical vapor deposition system includes a reaction chamber 200, a hydrogen supply section 202, a methane supply section 204, a silicon tetrachloride supply section 206, a silicon tetrachloride vaporizer 208, a pressure controller 210, an air extracting pump 212, a temperature controller 214 and so on, wherein a graphite base 216 is placed in the reaction chamber 200. In one exemplary embodiment, under conditions in which the process pressure is controlled to 1 Pa to $10^6$ Pa by the pressure controller 210, the temperature is adjusted to 900° C. to 1600° C. by the temperature controller 214, a precursor intake flow ratio is set to 0.1% to 1%, and deposition time is set to 10 minutes to 100 minutes, a 3C—SiC layer is formed on the surface of the graphite base. In addition, to reduce the chance of impurities contaminating the process, as the graphite base used in the deposition of silicon carbide, high purity graphite having an impurity content of 10 ppm to 400 ppm is required.

In the deposition process of silicon carbide, if the process pressure and the precursor intake flow ratio are controlled, the higher the reaction temperature, the higher the deposition rate of silicon carbide. Thus, larger crystal grains may be obtained. By contrast, the lower the reaction temperature, the lower the deposition rate of silicon carbide. Thus, smaller crystal grains may be obtained. By controlling the process pressure, the precursor intake flow ratio and the reaction temperature, the surface grain size of the silicon carbide film can be successfully controlled.

Figure 3:
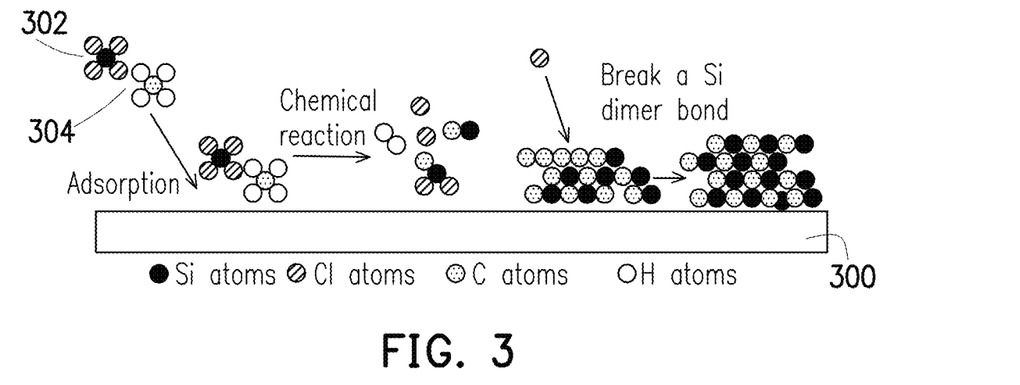
FIG. 3 is a schematic view of a silicon carbide (SiC) growth mechanism.

FIG. 3 is a schematic view of a silicon carbide (SiC) growth mechanism. As shown in FIG. 3, silicon tetrachloride 302 and methane 304 are adsorbed in advance onto a graphite base 300. Then, a chemical reaction is carried out, and a silicon dimer bond is broken, thus forming and depositing silicon carbide on the graphite base 300.

Figure 4:
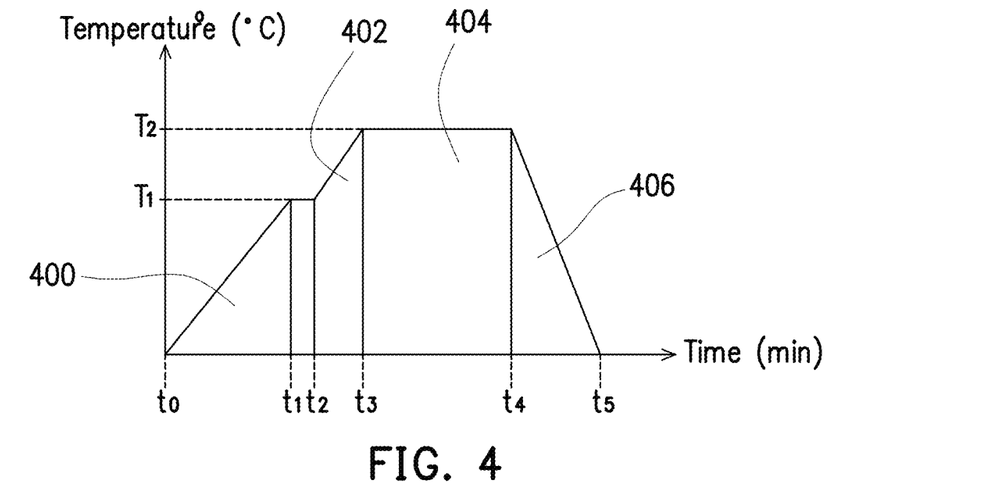
FIG. 4 is a schematic view of a multistage process of depositing silicon carbide.

FIG. 4 is a schematic view of a multistage process of depositing silicon carbide. As shown in FIG. 4, first stage heating 400 is performed (from time t0 to t1) under atmospheric pressure to raise the temperature from room temperature to temperature T1. After the temperature is maintained at temperature T1 for a period of time (from time t1 to t2), second stage heating 402 is performed under atmospheric pressure to raise the temperature from temperature T1 to temperature T2. Then, a SiC growth process 404 is performed under temperature T2 and the set process pressure, and the above conditions are maintained for a period of time (from time t3 to t4) in order to complete the SiC growth process. Then, cooling 406 is performed under atmospheric pressure to lower the temperature from temperature T2 to room temperature. Thus, a silicon carbide film is formed on the surface of the graphite base, thereby manufacturing a grinding disk test piece (silicon carbide grinding disk). A material structure analysis is conducted on this grinding disk test piece.

Figure 5:
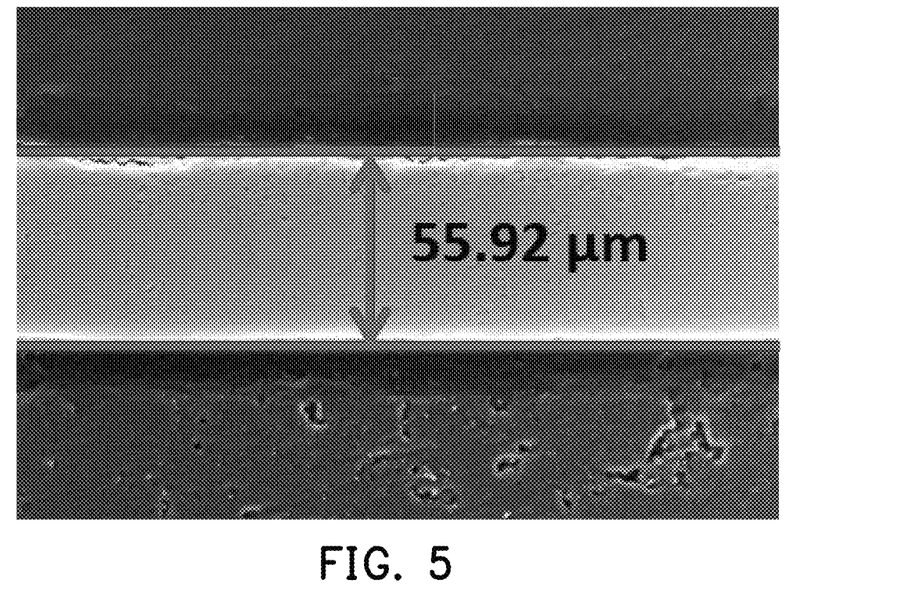
FIG. 5 is a scanning electron microscope (SEM) cross-sectional view of a grinding disk test piece.

FIG. 5 is a scanning electron microscope (SEM) photograph of a grinding disk test piece. After the grinding disk test piece is slicing-processed, a cross-section thereof is analyzed through observation by an SEM. As shown in FIG. 5, the silicon carbide film has a thickness of 55.92 µm.

Figure 6:
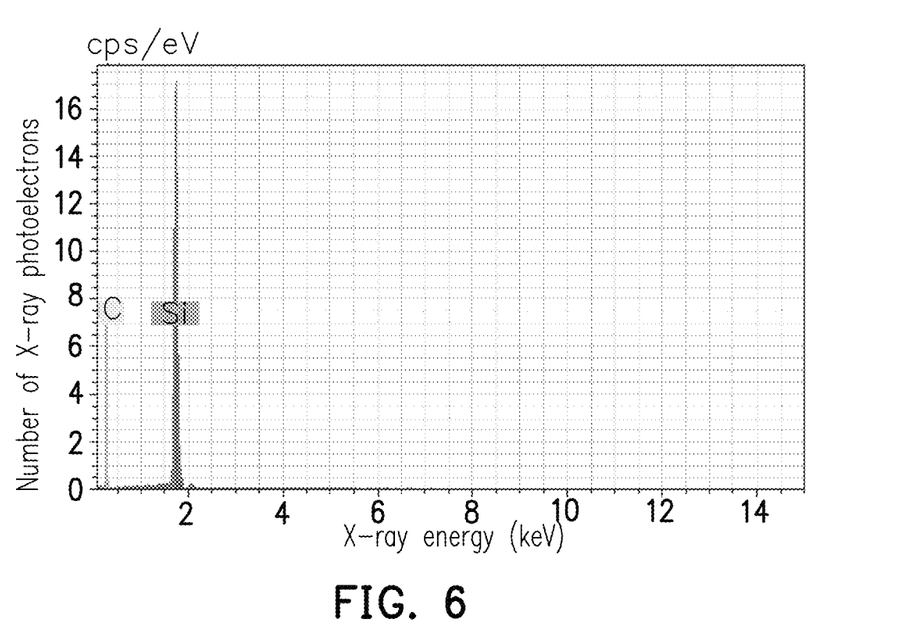
FIG. 6 is an energy-dispersive X-ray spectroscopy (EDS) spectrum of a grinding disk test piece.
Figure 7:
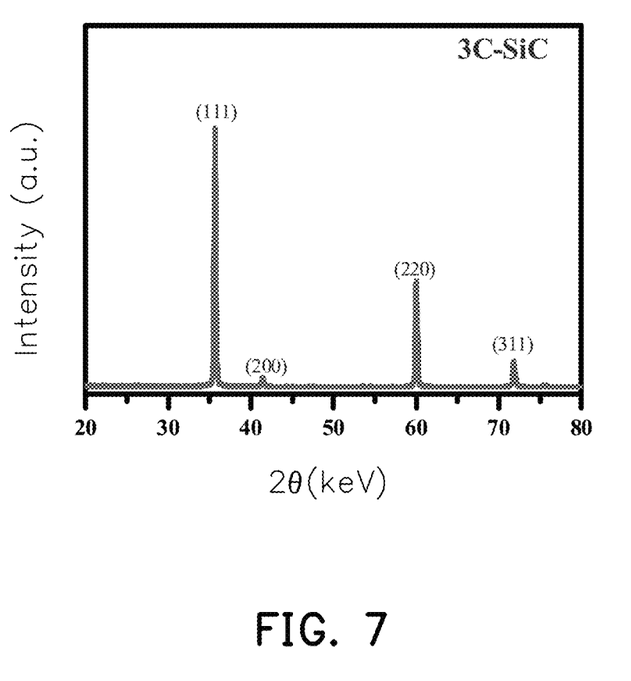
FIG. 7 is an X-ray diffraction (XRD) diagram of a grinding disk test piece.

FIG. 6 is an energy-dispersive X-ray spectroscopy (EDS) spectrum of a grinding disk test piece. As shown in FIG. 6, the composition of the silicon carbide film is analyzed through EDS, and it shows that the percentages of carbon atoms and silicon atoms are 52.37% and 47.63%, respectively. FIG. 7 is an X-ray diffraction (XRD) diagram of a grinding disk test piece. By comparing results of the XRD analysis with the Joint Committee on Powder Diffraction Standards (JCPDS) database, diffraction peaks (111), (200), (220) and (311) are obtained respectively. In addition, no notable deviation occurs in the angle of the major diffraction peak (111), which thus proves that this film has a 3C—SiC structure.

Observation of Surface Grains Between Grinding Disk Test Piece and Sandpaper

According to the above-disclosed manufacturing method, grinding disk test pieces with silicon carbide films having different surface grain sizes were prepared under different process parameters. The surface grains of the grinding disk test pieces were observed through an SEM. Then, a comparison of surface grain was made between the grinding disk test pieces with the silicon carbide films having different surface grain sizes and grinding sandpapers with different numbers.

According to the above-disclosed manufacturing method, at process temperatures of 1380° C., 1330° C. and 1280° C., a grinding disk test piece A, a grinding disk test piece B and a grinding disk test piece C were prepared, respectively.

Figure 8A:
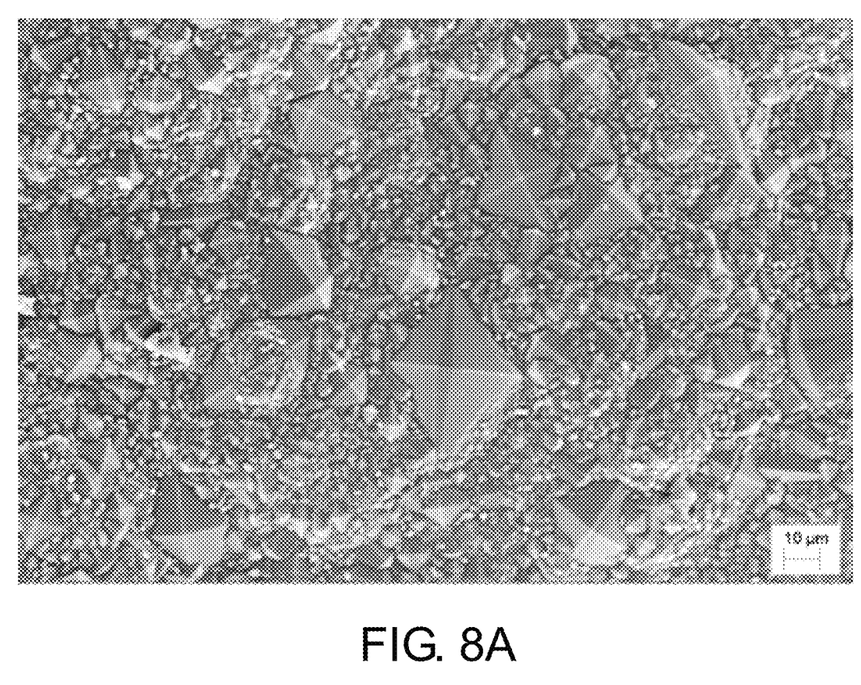
FIG. 8A and FIG. 8B are respectively SEM top-view of surface grains of a grinding disk test piece A of the disclosure and sandpaper #500.
Figure 8B:
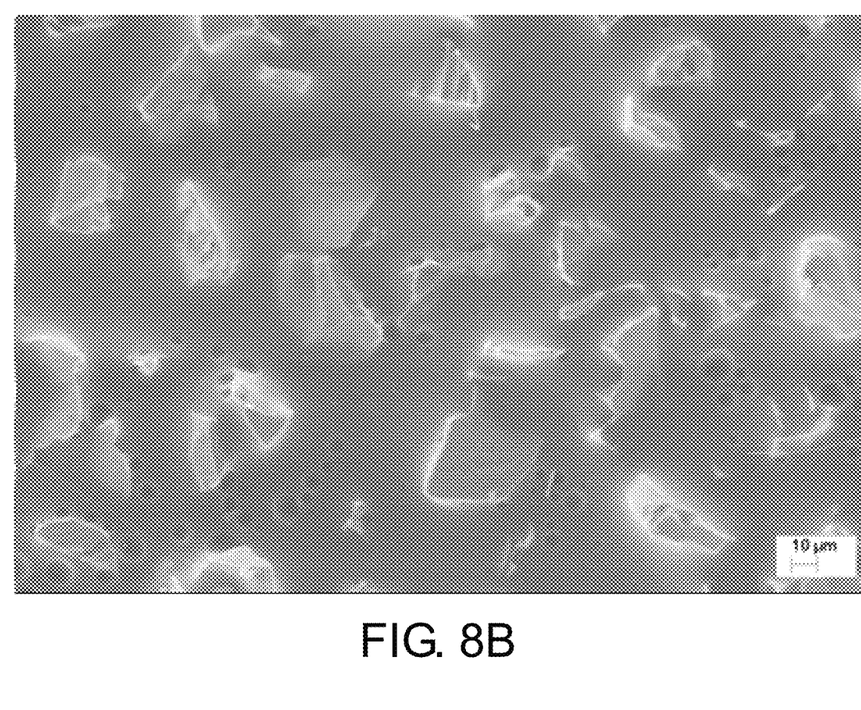
Figure 9A:
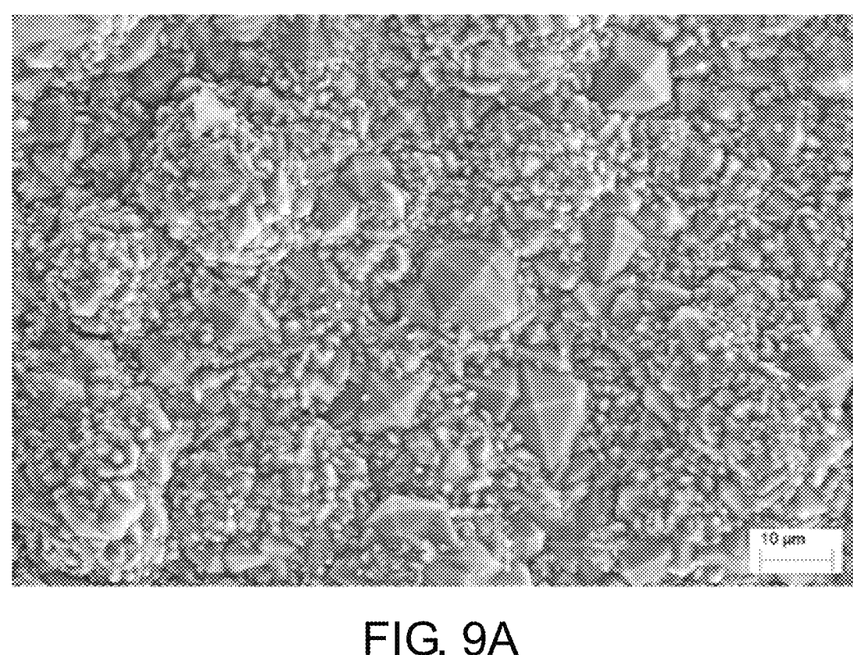
FIG. 9A and FIG. 9B are respectively SEM top-view of surface grains of a grinding disk test piece B of the disclosure and sandpaper #1200.
Figure 9B:
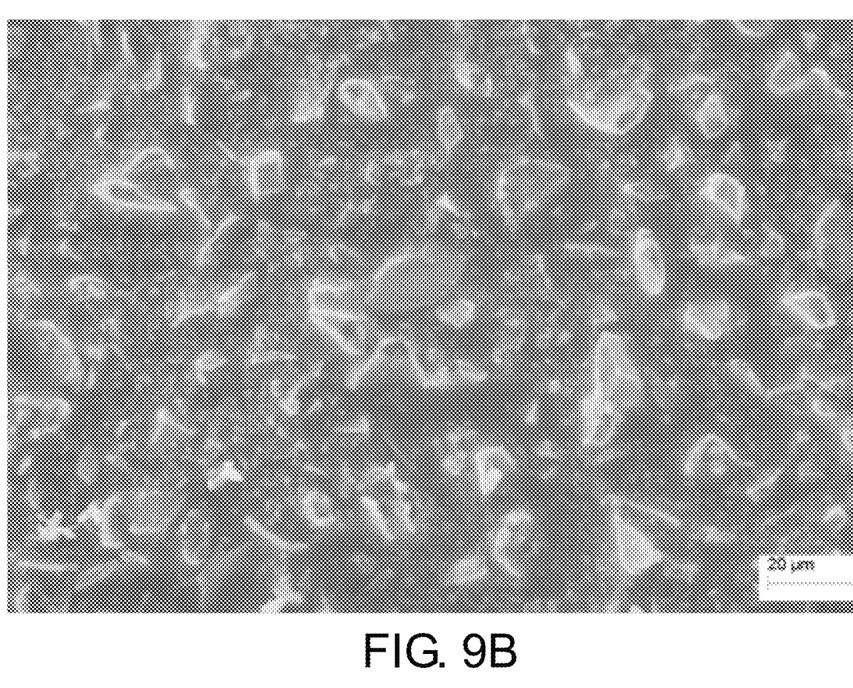
Figure 10A:
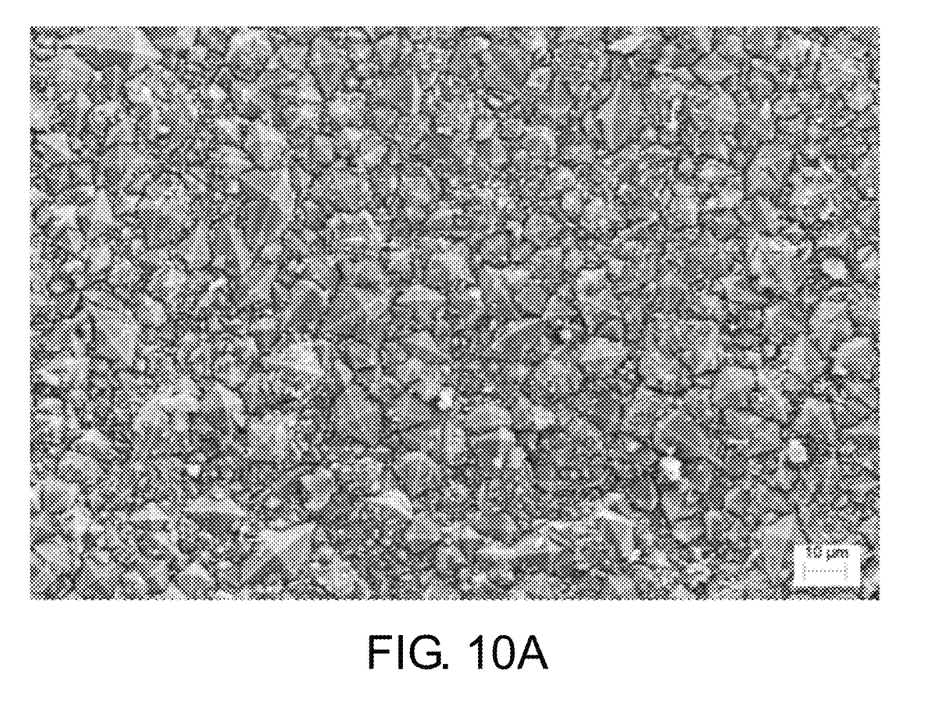
FIG. 10A and FIG. 10B are respectively SEM top-view of surface grains of a grinding disk test piece C of the disclosure and sandpaper #2400.
Figure 10B:
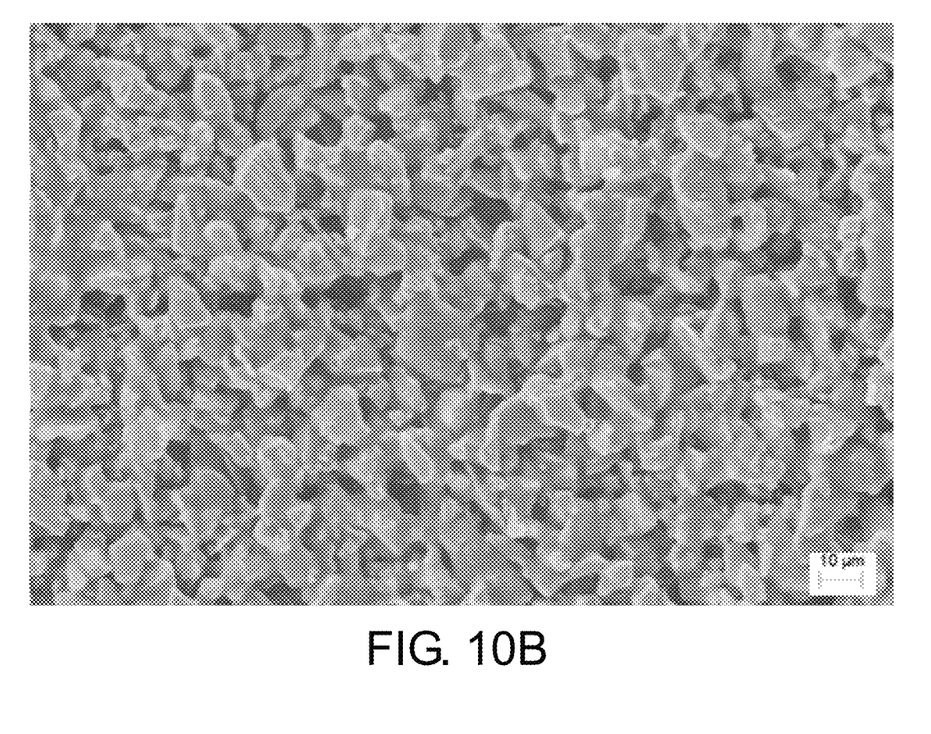

FIG. 8A and FIG. 8B are respectively SEM top-view of surface grains of the grinding disk test piece A of the disclosure and sandpaper #500. In the grinding disk test piece A prepared at the process temperature of 1380° C., the surface grain size of the silicon carbide film was 20 µm to 40 µm. FIG. 9A and FIG. 9B are respectively SEM top-view of surface grains of the grinding disk test piece B of the disclosure and sandpaper #1200. In the grinding disk test piece B prepared at the process temperature of 1330° C., the surface grain size of the silicon carbide film was 10 µm to 25 µm. FIG. 10A and FIG. 10B are respectively SEM top-view of surface grains of the grinding disk test piece C of the disclosure and sandpaper #2400. In the grinding disk test piece C prepared at the reduced process temperature of 1280° C., the surface grain size of the silicon carbide film was 5 µm to 15 µm. The surface grains of the silicon carbide films of the grinding disk test pieces A, B and C were the same as the surface grains of the sandpapers with the above-mentioned numbers.

Figure 11A:
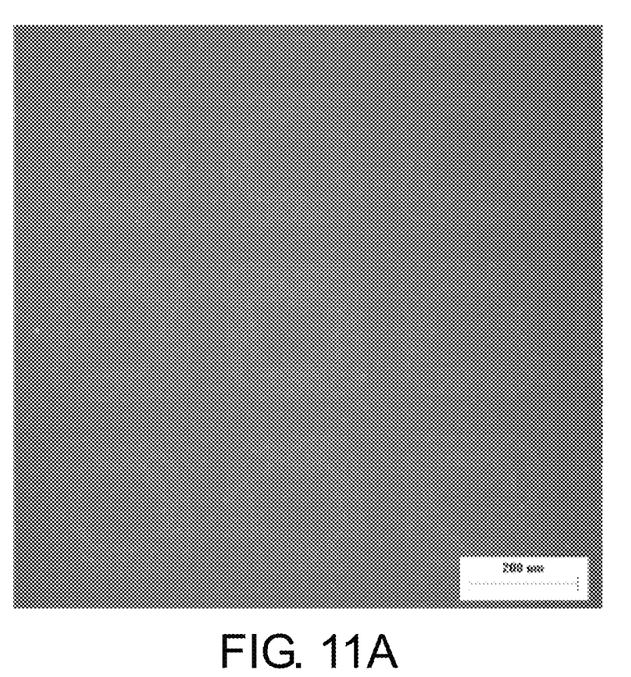
FIG. 11A and FIG. 11B are respectively optical microscope photographs of a special structure-processed substrate when not coated and when coated with a silicon carbide film.
Figure 11B:
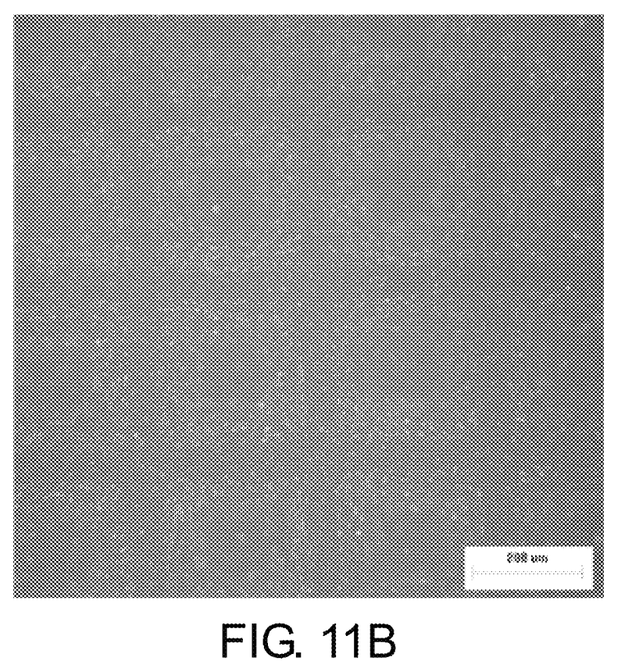

Surface Coating of Silicon Carbide Film on Special Structure-Processed Graphite Base FIG. 11A and FIG. 11B are respectively optical microscope photographs of a special structure-processed substrate when not coated and when coated with a silicon carbide film. A graphite base was processed in advance to form a special structure (e.g., a trench) on a surface of the graphite base. This special structure processing causes the silicon carbide to have a consistent direction, and the trench facilitates flow of slurry or scrapings. Thus, the chance that a surface of a workpiece is damaged by scratches is reduced, thereby optimizing the grinding process.

Hydrophobicity Testing on Grinding Disk Test Piece

Figure 12A:
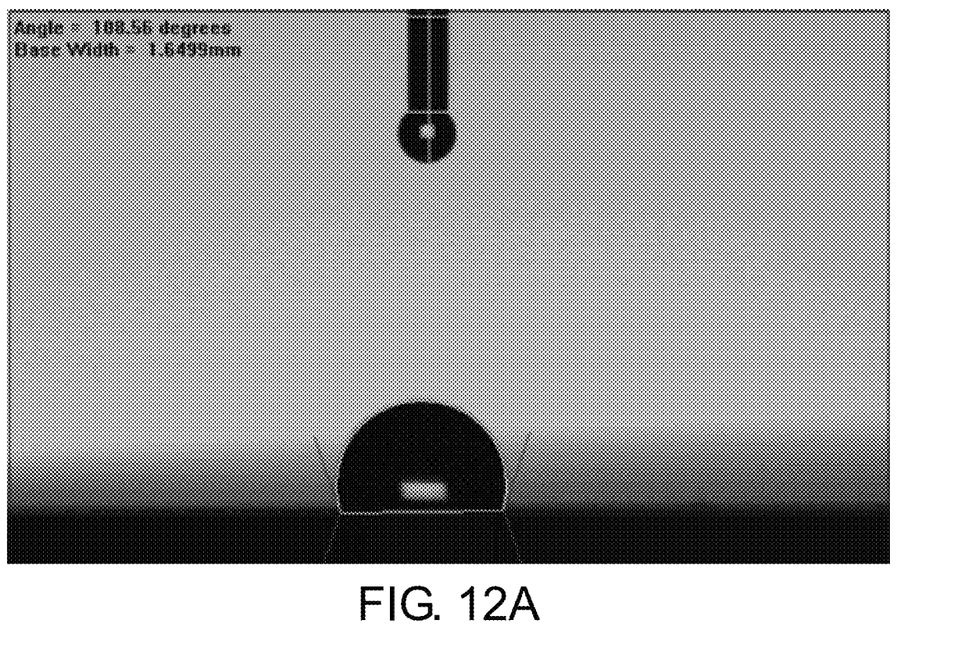
FIG. 12A and FIG. 12B are respectively photographs of a contact angle experiment on a grinding disk test piece and a grinding sandpaper.
Figure 12B:
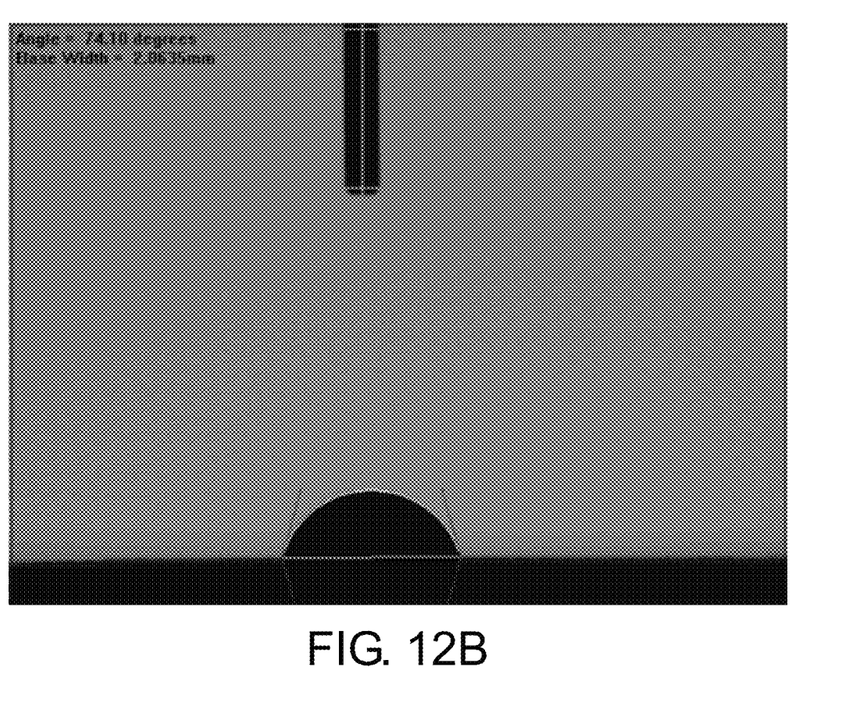

A prepared grinding disk test piece and a commercially available sandpaper were subjected to a water contact experiment to measure water contact angles thereof. FIG. 12A and FIG. 12B are respectively photographs of a contact angle experiment on a grinding disk test piece and a grinding sandpaper. As shown in FIG. 12A and FIG. 12B, the water contact angle of the grinding disk test piece of the disclosure was about 108.6° and the water contact angle of the commercially available sandpaper was about 74.1°. The above result proves that a silicon carbide film prepared by CVD has a larger water contact angle, namely higher hydrophobicity, and thus has a better scrapings removing function, so that the occurrence of scratches can be reduced and the surface of the workpiece can be polished to achieve a mirror-like effect.

In summary, the grinding disk according to the disclosure provides a grinding tool having higher abrasion resistance and higher hydrophobicity. In the method of manufacturing a grinding disk according to the disclosure, the grain size of the graphite base is directly adjusted and controlled through process parameters so as to obtain high hydrophobicity. The grinding disk according to the disclosure has higher hydrophobicity, and thus has a better scrapings removing function. Thus, the occurrence of scratches can be reduced and a surface of a workpiece can be polished to achieve a mirror-like effect. Moreover, the grinding disk according to the disclosure has an abrasion-resistant silicon carbide film, and thus has a relatively long lifetime.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A grinding disk, comprising:
    a graphite base, wherein a surface of the graphite base has at least one trench having a V shape in cross-section; and
    a silicon carbide film covering the graphite base,
    wherein the silicon carbide film has a surface grain size of 5 μm to 80 μm.

2. The grinding disk according to claim 1, wherein the trench has a depth of 0.1 mm to 10 mm and a width of 0.05 mm to 20 mm.

3. The grinding disk according to claim 1, wherein the silicon carbide film has a cubic silicon carbide crystal.

4. The grinding disk according to claim 3, wherein the silicon carbide film has a carbon content of 30 at. % to 70 at. %, and a silicon content of 30 at. % to 70 at. %.

5. The grinding disk according to claim 3, wherein the silicon carbide film has a thickness of 30 μm to 1000 μm.

6. The grinding disk according to claim 1, wherein the silicon carbide film has surface roughness of 1.0 μm to 10.0 μm.

7. A method of manufacturing a grinding disk, the method comprising:
    providing a graphite base, wherein a surface of the graphite base has at least one trench having a V shape in cross-section; and
    forming a silicon carbide film on a surface of the graphite base,
    wherein in the step of forming the silicon carbide film on the surface of the graphite base, the silicon carbide film is formed by chemical vapor deposition using a carbon precursor, a silicon precursor, and hydrogen as a reaction gas.

8. The method of manufacturing a grinding disk according to claim 7, wherein in the step of forming the silicon carbide film on the surface of the graphite base, a reaction pressure is 1 Pa to 106 Pa.

9. The method of manufacturing a grinding disk according to claim 7, wherein in the step of forming the silicon carbide film on the surface of the graphite base, a reaction temperature is 900° C. to 1600° C.

10. The method of manufacturing a grinding disk according to claim 7, wherein the carbon precursor is at least one selected from a group consisting of methane, ethane, acetylene and ethylene.

11. The method of manufacturing a grinding disk according to claim 7, wherein the silicon precursor is at least one selected from a group consisting of dichlorosilane, trichlorosilane and silicon tetrachloride.

12. The method of manufacturing a grinding disk according to claim 7, wherein the silicon carbide film has a cubic silicon carbide crystal.

13. The method of manufacturing a grinding disk according to claim 7, wherein in the step of forming the silicon carbide film on the surface of the graphite base, a hot-wall chemical vapor deposition system is used.

* * * * *